US011558032B2

(12) United States Patent
Dasgupta et al.

(10) Patent No.: US 11,558,032 B2
(45) Date of Patent: Jan. 17, 2023

(54) RF FILTERS AND RESONATORS OF CRYSTALLINE III-N FILMS

(71) Applicant: INTEL CORPORATION, Santa Clara, CA (US)

(72) Inventors: Sansaptak Dasgupta, Hillsboro, OR (US); Bruce A. Block, Portland, OR (US); Paul B. Fischer, Portland, OR (US); Han Wui Then, Portland, OR (US); Marko Radosavljevic, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 987 days.

(21) Appl. No.: 16/327,720

(22) PCT Filed: Sep. 30, 2016

(86) PCT No.: PCT/US2016/054699
§ 371 (c)(1),
(2) Date: Feb. 22, 2019

(87) PCT Pub. No.: WO2018/063299
PCT Pub. Date: Apr. 5, 2018

(65) Prior Publication Data
US 2019/0214965 A1 Jul. 11, 2019

(51) Int. Cl.
*H03H 9/05* (2006.01)
*H03H 9/13* (2006.01)
(Continued)

(52) U.S. Cl.
CPC .............. *H03H 9/205* (2013.01); *H03H 3/02* (2013.01); *H03H 9/02015* (2013.01);
(Continued)

(58) Field of Classification Search
CPC .................. H01L 41/04; H01L 41/047; H01L 41/0471; H01L 41/08; H01L 41/083; H01L 41/09;
(Continued)

(56) References Cited

U.S. PATENT DOCUMENTS 7,417,360 B2 * 8/2008 Kamiyama ............ H03H 9/706
310/348
7,623,007 B2 * 11/2009 Nakatsuka ............. H03H 9/173
310/330
(Continued)

FOREIGN PATENT DOCUMENTS

JP 2009124640 A 6/2009
WO 2018063299 A1 4/2018

OTHER PUBLICATIONS

International Search Report and Written Opinion received for PCT Application No. PCT/US2016/054699. dated Jun. 20, 2017. 11 pages.
International Preliminary Report on Patentability received for PCT Application No. PCT/US2016/054699. dated Apr. 2, 2019. 7 pages.
(Continued)

*Primary Examiner* — Levi Gannon
(74) *Attorney, Agent, or Firm* — Schwabe, Williamson & Wyatt, P.C.

(57) ABSTRACT

A bulk acoustic resonator architecture is fabricated by epitaxially forming a piezoelectric film on a top surface of post formed from an underlying substrate. In some cases, the acoustic resonator is fabricated to filter multiple frequencies. In some such cases, the resonator device includes two different resonator structures on a single substrate, each resonator structure configured to filter a desired frequency. Including two different acoustic resonators in a single RF acoustic resonator device enables that single device to filter two different frequencies in a relatively small footprint.

25 Claims, 6 Drawing Sheets

(51) Int. Cl.
- *H03H 9/205* (2006.01)
- *H03H 3/02* (2006.01)
- *H03H 9/17* (2006.01)
- *H03H 9/02* (2006.01)
- *H03H 9/64* (2006.01)
- *H03H 9/58* (2006.01)
- *H03H 3/007* (2006.01)

(52) U.S. Cl.
CPC .... *H03H 9/02031* (2013.01); *H03H 9/02086* (2013.01); *H03H 9/02157* (2013.01); *H03H 9/132* (2013.01); *H03H 9/172* (2013.01); *H03H 9/587* (2013.01); *H03H 9/6436* (2013.01); *H03H 2003/0071* (2013.01); *H03H 2003/021* (2013.01)

(58) Field of Classification Search
CPC ....... H01L 41/094; H01L 41/22; H01L 41/27; H01L 41/277; H01L 41/29; H01L 41/293; H01L 41/297; H01L 41/31; H01L 41/311; H03H 3/02; H03H 2003/0071; H03H 2003/021; H03H 2003/022; H03H 9/02007; H03H 9/02015; H03H 9/02023; H03H 9/02031; H03H 9/02157; H03H 9/0504; H03H 9/131; H03H 9/132; H03H 9/205
See application file for complete search history.

(56) References Cited

U.S. PATENT DOCUMENTS

| | | |
|---|---|---|
| 2005/0012571 A1* | 1/2005 | Song .................... H03H 9/0547 333/192 |
| 2007/0176710 A1 | 8/2007 | Jamneala et al. |
| 2008/0284541 A1 | 11/2008 | Chitnis |
| 2009/0127978 A1* | 5/2009 | Asai ........................ H03H 3/02 29/25.35 |
| 2010/0117763 A1 | 5/2010 | Suwa et al. |
| 2013/0207746 A1 | 8/2013 | Gupta |
| 2014/0132117 A1 | 5/2014 | Larson, III |
| 2015/0357987 A1 | 12/2015 | Shealy |
| 2016/0197597 A1* | 7/2016 | Yamada .................... H03H 3/02 29/25.35 |
| 2017/0155038 A1* | 6/2017 | Caraveo ................ B81C 1/0015 |

OTHER PUBLICATIONS

Davis, Robert F., "Substrates and epitaxial deposition processes for Group III-nitride thin films and power device heterostructures," Materials Research Society BULLETIN, vol. 40, May 2015. 6 pages.

Hiramatsu, Kazumasa, "Epitaxial lateral overgrowth techniques used in group III nitride epitaxy," Institute of Physics Publishing, Journal of Physics: Condensed Matter 13, 2001, pp. 6961-6975.

Office Action from Taiwan Patent Application No. 106127644, dated Apr. 13, 2021, 2 pgs.

Office Action from Taiwan Patent Application No. 106127644, dated Dec. 30, 2020, 6 pgs.

* cited by examiner

RF FILTERS AND RESONATORS OF CRYSTALLINE III-N FILMS

CROSS-REFERENCE TO RELATED APPLICATIONS

This patent application is a U.S. National Phase Application under 35 U.S.C. § 371 of International Application No. PCT/US2016/054699, filed on Sep. 30, 2016, the entire contents of which is hereby incorporated by reference herein.

BACKGROUND

Various electronic products, including mobile computers such as smartphones, laptops, and tablets include various circuits between an antenna and a digital baseband system, generally referred to as the radio frequency (RF) frontend. A typical RF frontend includes RF filters, low-noise amplifiers (LNAs), RF power amplifiers, and RF switches, each of which may be located on a separate integrated circuit chip. One type of RF filter is generally referred to as a bulk acoustic wave filter. Bulk acoustic wave filters include thin-film bulk acoustic resonators (or so-called TFBARs, or more simply, FBARs).

Figure 1:
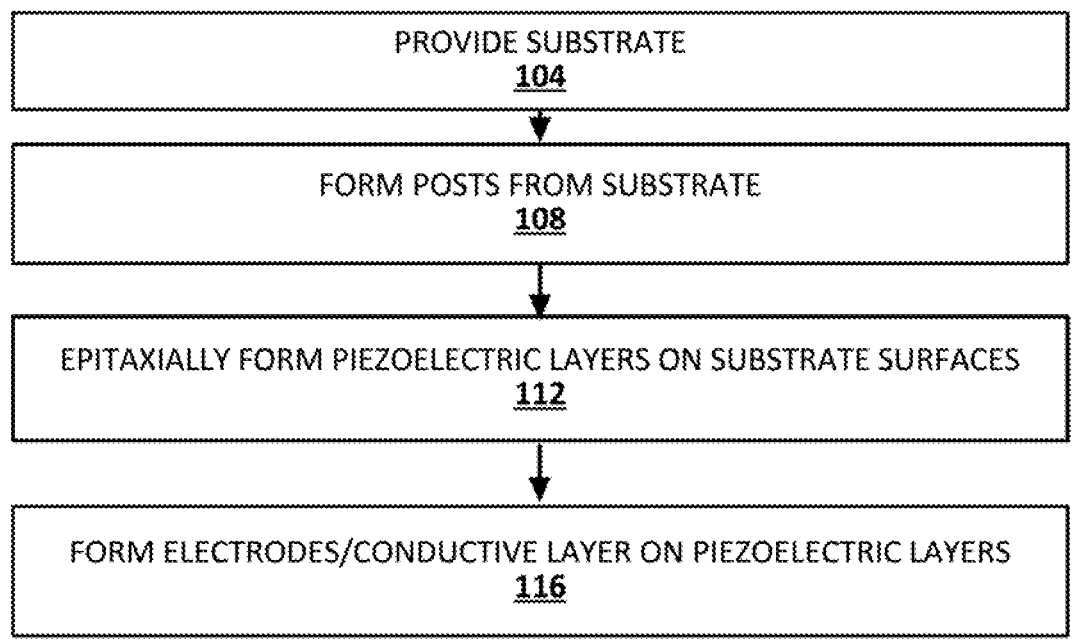
FIG. 1 is a method flow diagram of an example method for fabricating an example thin film bulk acoustic resonator, in accordance with an embodiment of the present disclosure.

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. In short, the figures are provided merely to show example structures.

DETAILED DESCRIPTION

Techniques are disclosed for forming an acoustic resonator that includes a thin film bulk acoustic resonator (TFBAR or simply BAR) structure. The TFBAR is fabricated by epitaxially forming a piezoelectric layer (also referred to herein as a "film") on a top surface of a salient, or "post," that is formed from, or on, an underlying substrate. In other words, a single crystal piezoelectric film has a same crystal structure and a same crystallographic orientation as the crystal of the underlying post. Epitaxially formed piezoelectric films significantly reduce signal loss and cross-talk in filtered RF signals compared to RF signals filtered by conventional BARs that include a sputtered, polycrystalline piezoelectric film. In some embodiments, the acoustic resonator of the present disclosure is fabricated to have multiple resonant frequencies so as to provide a multi-frequency filter. In one such embodiment, the acoustic resonator includes both the post-based TFBAR structure having a first resonant frequency and a surface acoustic wave (SAW) resonator having a second resonant frequency within a same RF acoustic resonator device. Including these two different frequency ranges of interest in a single RF acoustic resonator device on the same substrate, as variously described herein (rather than discrete individual filters and substrates), enables filtering of two different frequencies using a same RF filtering circuit. Conventionally, RF filtering circuits are fabricated to filter only a single frequency from a plurality of frequencies. For purposes of clarity, filtering generally refers to separating or otherwise selectively passing one or more desired frequencies of interest from a wider range of frequencies included in a given signal, such as an RF signal received via an antenna. The antenna converts the wireless RF signal to an electrical signal. The electrical signal can be then be applied to RF filtering circuitry and amplifier circuitry. The resulting signal can then be provided for subsequent receiver processing (e.g., converted to a voice call, music, etc.).

General Overview

Conventional RF BARs (which are one type of component of the front end of an RF filter circuit) often include a bottom electrode, a top electrode, and a piezoelectric film (usually fabricated by thin film sputtering) that is disposed between the two electrodes. An applied range of RF frequencies ("applied frequencies") causes a periodic voltage fluctuation across the bottom electrode and the top electrode. This periodic voltage fluctuation in turn causes a properly dimensioned piezoelectric layer disposed between the electrodes to vibrate at a frequency that corresponds to one of the incident RF frequencies. An RF frequency that causes vibration of the piezoelectric layer is referred to herein as an "excitation frequency" or a so-called "resonant frequency." The physical vibration of the piezoelectric film corresponding to the excitation frequency is then converted into an electrical signal by other elements of the RF filter circuit that are connected to the resonator. The filtered excitation frequency ("resonant frequency" for brevity), transformed into an electrical signal, can then be used to generate an audio signal (e.g., for an audio call in a wireless telephone, or music for aural presentation by one or more audio speakers), an instruction, or bit of data (e.g., for a mobile wireless computing device), among other signal processing and RF receiver frontend applications. In some cases, the conventional BAR is disposed over an air cavity in a substrate. The air cavity allows the piezoelectric film of the BAR to vibrate freely, unencumbered by a damping effect from a solid, underlying substrate. The air cavity also prevents energy of the vibration from being transmitted to the underlying substrate, which would attenuate the RF signal before conversion into the electrical signal. Such conventional RF BARs include a sputtered aluminum nitride film as the piezoelectric element. Sputtered films generally have at least two disadvantages when used in a BAR.

First, a piezoelectric film of uniform thickness (usually a multiple of ½ of the wavelength of the desired frequency) is desired in a BAR to better filter only the desired frequency from among a plurality of incident frequencies. That is, a film having a non-uniform thickness may resonate at frequencies other than the desired frequency. Uniformly thick films are difficult to accomplish in practice when formed by sputtering. While film thickness of a sputtered aluminum nitride film can be made more uniform with post-deposition processing (e.g., ion milling), this increases manufacturing time and costs and reduces thickness variations to only the micron level. Micron level thickness variation is inadequate to limit resonation of a piezoelectric layer to a single desired frequency. Second, sputtered films are polycrystalline (rather than monocrystalline or single crystal). The individual crystals of a sputtered polycrystalline film in a BAR have different orientations within the film and thus vibrate in multiple directions when excited by an excitation frequency. The result of such disadvantages is increased signal loss and a broad filtered signal distribution (e.g., a full width at half maximum (FWHM) at from 2° to 4°) that can increase cross-talk between signals or otherwise degrade the performance of the BAR. Both of these reasons decrease the performance of sputtered piezoelectric films in RF resonator devices and their associated filter circuits. Another challenge when using conventional RF BARs is that they are configured to filter only a single frequency. Computing and communications devices that use multiple filtered frequencies must therefore be designed to include multiple discrete filtering circuits, each configured to filter a different frequency of interest. This adds manufacturing complexity and cost and overall footprint size to the integrated circuits and the corresponding computing and communications devices that include these discrete filtering integrated circuits.

Thus, architectures and techniques for fabricating RF resonator architectures are described herein that can be used, for example, in filtering applications. Some embodiments are configured to filter multiple RF frequencies within a single acoustic resonator device on a single substrate. In one embodiment, an RF filter is described that includes an RF BAR structure ("first resonator"). In some embodiments, this structure of the first resonator includes an epitaxial aluminum nitride (AlN) layer formed on a top surface of single crystal semiconductor post that is formed on or from an underlying substrate. The epitaxial AlN layer is grown to laterally extend beyond side surfaces of the post. This "overgrowth" reduces a proportion of the interfacial area between the epitaxial AlN layer and the post relative to a surface area of the AlN layer as whole, thus providing an air gap underneath at least a portion of the AlN layer and reducing signal loss into the post during excitation of the AlN layer. A thickness of the epitaxial AlN layer is selected according to the frequency to be filtered from the incident plurality of frequencies. Because the AlN layer is epitaxially grown, rather than sputtered, the thickness of this single crystal film is uniform and can be controlled in a relatively precise manner. This improves filtering accuracy and resonant signal quality. One example of this improved quality is a reduction in filtered signal variation, as indicated by a full width at half maximum (FWHM) signal distribution (amplitude vs. frequency) of less than 1.0°, such as from 0.3° to 0.5°, according to some embodiments. Also, because the epitaxially deposited layers are single crystals, the layers vibrate in a single direction, which also reduces signal loss from the resonator.

In another embodiment, an architecture is described that includes multiple resonant frequencies on the same substrate. In one such embodiment, an integrated circuit is provided that includes both a first resonator (e.g., FBAR) and a second resonator ("surface area wave (SAW) resonator") formed on the same substrate. The first resonator can be configured, for example, as provided above (e.g., an FBAR including an AlN layer epitaxially grown on a single crystal semiconductor post). The second resonator is disposed on an epitaxial AlN layer having a thickness that is less than the AlN layer thickness of the first resonator. As a result, each of the first resonator and the second resonator is configured to filter a different incident frequency within a single filter device. Thus, a single filter circuit can be configured to filter two different RF frequencies.

Numerous configurations and filtering schemes will be apparent in light of this disclosure. In some examples, the RF resonator architectures configured in accordance with some embodiments can resonate at any two applied frequencies from 3 GHz to 10 GHz and from 25 GHz to 30 GHz. It will be appreciated that any frequency can be selected for filtering by forming the thicknesses of the epitaxially deposited piezoelectric layers of the first resonator and the second resonator, and selecting the periodicity of interdigitated electrodes of the second resonator to correspond to the frequencies desired to be filtered.

Example RF Resonator Architecture

Figure 2A:
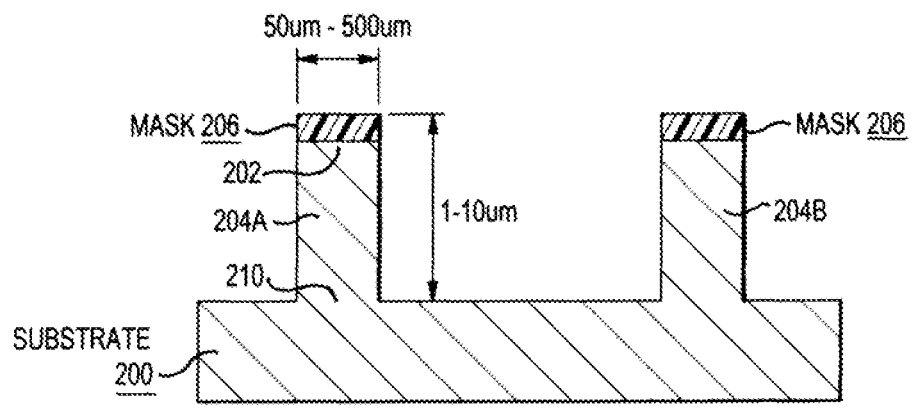
FIGS. 2A-2C are schematic cross-sectional views of the example thin film bulk acoustic resonator fabricated with the method 100 at progressive stages of fabrication, in accordance with an embodiment of the present disclosure.
Figure 2A:
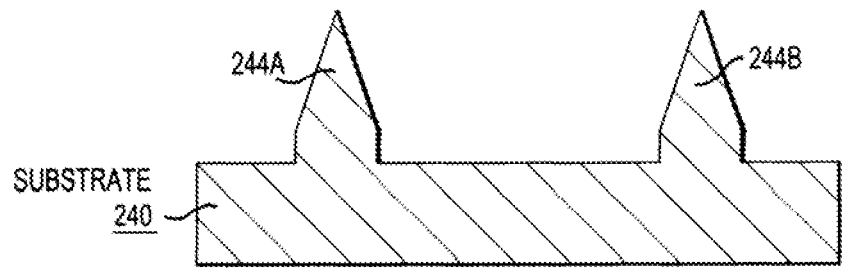
Figure 2B:
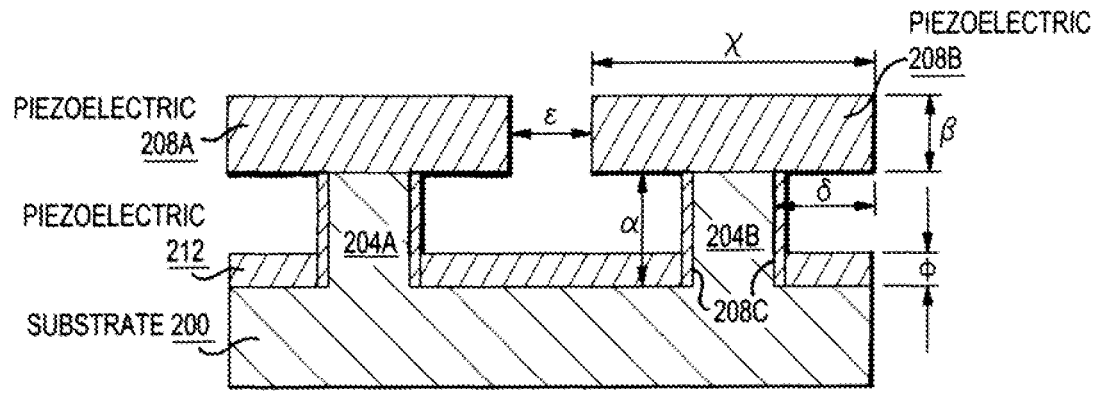
Figure 2C:
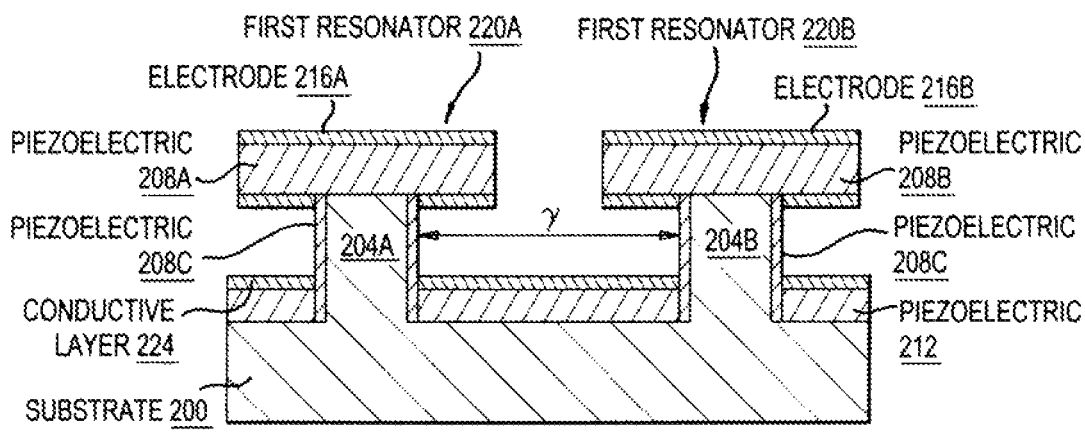

FIG. 1 is a method flow diagram of an example method 100 for fabricating the example thin film bulk acoustic resonator, in accordance with an embodiment of the present disclosure. Concurrent reference to the schematic cross-sectional views shown in FIGS. 2A to 2C that depict various stages of fabrication of the first resonator facilitates explanation of the example method 100. The various features in FIGS. 2A to 2C are for convenience of explanation and are not necessarily drawn to scale.

The method 100 begins by providing a substrate 200 on which to fabricate a first resonator and, optionally, a second resonator, in embodiments of the present disclosure. Examples of the substrate 200 include single crystal silicon substrates. The silicon substrate 200 can be oriented in any of the [111] direction, [110] direction, or [100] direction. The orientation of the single crystal silicon substrate determines the convenience by which some features of the resonators of the present disclosure are fabricated, as described below. Unless otherwise noted, the example substrates 200 described herein are [111] silicon single crystals.

Other types of substrates can be substituted for [111] silicon. For example, any semiconducting material that can support epitaxial growth (e.g., a lattice mismatch of less than 50%) of AlN, ZnO, or piezoelectric Wurtzites thin films may be used as the substrate 200. [100] silicon may also be used as a substrate. Even though the lattice mismatch between [100] silicon and piezoelectric materials described herein is greater than that of [111] silicon.

The silicon substrate 200 may also include a buried oxide (BOX) layer, or be a semiconductor-on-insulator (or "XOI" where X is any semiconductor) substrate. One specific XOI substrate example includes a blanket layer of silicon dioxide (SiO$_2$) with a silicon (Si) substrate. The presence or absence of an underlying oxide or insulator may affect the performance of other semiconductor devices in an integrated circuit associated with the resonators of the present disclosure, but generally will not affect the fabrication or performance of the resonators themselves.

The method 100 continues by forming 108 at least one post 204 (two of which, 204A and 204B, are shown in FIG. 2A) from the substrate 200. This formation 108 is accomplished by applying a mask 206 to selected portions of the substrate 200 and removing substrate 200 material from areas of the substrate left exposed by the mask 206. Examples of the mask 206 include "hard" masks (i.e., not photoactive polymers), that include silicon nitride (SiN) and silicon oxide (SiO$_2$). Other "hard mask" materials may also be used to fabricate a mask 206 that protects the underlying substrate portions from removal by an etch. The material of the substrate 200 unprotected by the mask 206 is removed using, for example, an etch process that favors the removal of the substrate 200 material in preference to removal of the mask 206 material. Examples of such an etch process include deep reactive ion etches (e.g., the "Bosch process") that bombard the exposed substrate surfaces with reactive ions, such as ions of sulfur hexafluoride. An advantage of using a deep reactive ion etch is that these etches can produce sidewalls that are nearly vertical, such as those shown in FIG. 2A.

As shown in FIG. 2A, removal of portions of the substrate 200 unprotected by mask 206 produces posts 204A and 204B. Each of the posts 204 has a first end 202 that is exposed upon removal of the mask 206, and a second end 210 that is in contact with (and in this case, integral with) the substrate 200. Each of the posts 204 also has a width that is defined by side surfaces of each of the posts.

In the examples shown, the at least one post 204 is from between 1 μm and 10 μm high (as measured from an exposed surface of the substrate 200 to a surface of the first end adjacent to the mask 206) and from 50 μm to 500 μm wide. In examples, the at least one post 204 has a height within any of the following ranges: from 1 μm to 5 μm; from 5 μm to 10 μm; and from 3 μm to 8 μm. In examples, the posts 204 have a width within any of the following ranges: from 50 μm to 100 μm; from 75 μm to 450 μm; from 100 μm to 300 μm; from 200 μm to 400 μm; and from 300 μm to 500 μm. Upon formation 108 of the at least one post 204, the mask 206 is removed.

The crystallographic orientation of the silicon substrate 200 shown in FIG. 2A is [111], which facilitates the epitaxial growth of an AlN piezoelectric film on a top surface of the post, as is described below. However, other crystallographic orientations of a silicon substrate facilitate the fabrication of different configurations of the posts. For example, as shown in FIG. 2A', a single crystal silicon substrate 240 has a (100) crystallographic orientation. In this (100) orientation, posts 244 (two of which, 244A and 244B, are shown) can be formed 108 as described above in the context of FIG. 2A. The posts 244 are then shaped into a triangular cross-section by using a hot potassium hydroxide (KOH) or tetramethyl-ammonium hydroxide (TMAH) etch, either of which can effectively remove many crystallographic planes of silicon except {111} planes.

In other words, the {111} planes in a (100) single crystal silicon substrate 240 act as an etch stop to either of a hot KOH or TMAH etch. Because of the orientation of the {111} planes in a [100] single crystal silicon substrate 240, the cross-section of a posts 244 is triangular after the hot KOH or TMAH etch. The benefit of a triangular cross-section of a post 244 is that an interfacial area between a top of a post and a piezoelectric layer (described below) is reduced.

Reducing this interfacial area also reduces damping and signal loss from a vibrating piezoelectric layer into an adjacent post, as described above in the context of conventional BARs.

While any of the following may be performed on either of posts 204 or 244, the figures and description presume that of post 204 for convenience of explanation.

Having formed a post 204, a first piezoelectric layer 208 is epitaxially formed 112 on a surface of the first end 202 of the post 204 exposed by the removal of the mask 206. During the same formation 112 process, a second piezoelectric layer 212 is formed on exposed portions of the substrate 200 that are not occupied by the post 204.

The epitaxially formed 112 first piezoelectric layer 208 and second piezoelectric layer 212 are formed generally with III(A)-N compounds, such as AlN or AlGaN (in which the Al content is greater than 50 atomic %). AlN is a convenient material for forming an epitaxial piezoelectric layer 208 on the (111) planes on the exposed surface of the first end 202 of the post 204 and on the exposed surface of the silicon substrate 200 (for a [111] single crystal silicon substrate) because the lattice mismatch is approximately 19%. A lattice mismatch of less than 25% can support epitaxial growth. Other group III(A) elements that can be used to form the piezoelectric layer of the present disclosure include, but are not limited to, boron, gallium, indium, and tantalum.

Other types of piezoelectric materials may also be used form 112 the piezoelectric layers of the present disclosure. These include ZnO and Wurtzite materials. Formation 112 is generally performed using metalorganic vapor phase epitaxial deposition (MOCVD, alternatively known as organometallic vapor phase epitaxy (OMVPE)) using appropriately selected precursors for the piezoelectric material to be formed. MOCVD generally begins by introducing gas phase transport of vaporous organometallic precursors and carrier gasses (e.g., argon) into a reaction chamber. Depending on the material to be deposited, nitrogen containing hydrides and diluent gases (often H$_2$ or N$_2$) are also introduced into the reaction chamber with the precursor vapors. The diluent gases suppress pyrolysis of the vapor phase precursors prior to the precursors reaching the heated substrate on which the final material is intended to be deposited. Common precursors for the fabrication of Group III-nitride films (including Group IIIa elements, such as AlN and GaAlN films, like those described herein) include trimethyl aluminum ((CH$_3$)$_3$Al), triethylgallium ((C$_2$H$_5$)$_3$Ga), among others. Reaction temperatures are often between 500° C. and 1000° C. with gas pressures between 40 Torr and 500 Torr. Further general details regarding MOCVD deposition of Group III-nitride films may be found in "Substrates and epitaxial deposition processes for Group III-nitride thin films and power device heterostructures," by Robert F. Davis, published in MRS Bulletin, volume 40, in May 2015.

Various dimensions of the at least one post 204, and the first and the second piezoelectric films 208, 212 are indicated in FIG. 2B. The dimension α corresponds to the height of one of the posts 204 indicated above in the context of FIG. 2A and need not be repeated.

The dimension β is a thickness of the first piezoelectric film 208 and is measured from an interface of the first piezoelectric film 208 with a corresponding post 204 and an opposing exposed top surface of the first piezoelectric film 208. As indicated above, the thickness (dimension $\beta$) of a piezoelectric layer is selected based on the wavelength of the excitation frequency that is to be filtered (i.e., so the frequency resonates the piezoelectric layer). Generally, the dimension $\beta$ is a multiple of ½ of a wavelength of the frequency selected to resonate. The dimension $\beta$ can be within any of the following ranges: from 1 µm to 3 µm; from 2 µm to 3 µm; from 1.5 µm to 3 µm; and from 1.5 µm to 2 µm.

The dimension $\chi$ is a width of the first piezoelectric film 208 and can be within any of the following ranges: from 60 µm to 530 µm; from 60 µm to 400 µm; from 100 µm to 400 µm; and from 200 µm to 300 µm. As shown, the width $\chi$ extends beyond the width of the post 204 which, as explained above, reduces the vibrational energy lost from the piezoelectric layer to the underlying post.

The dimension $\delta$ quantifying the overgrowth width (i.e., a distance between a side surface of a post 204 and a side surface of the first piezoelectric film 208 can be within any of the following ranges: from 5 µm to 15 µm; from 5 µm to 10 µm; from 10 µm to 15 µm; and from 7.5 µm to 12 µm. Generally, the dimension $\delta$ of the overgrowth is from three times to five times the thickness $\beta$ of the first piezoelectric film 208.

This "overgrowth" of the dimension $\delta$ beyond the width of the post if accomplished using lateral epitaxial overgrowth (LEO, alternatively known as epitaxial lateral overgrowth or ELO). LEO can be performed by depositing the material to be overgrown by supplying organometallic precursors to a substrate using a low pressure OMPVE process. Conventional LEO techniques use a mask to conceal all but a small portion of the substrate, which acts as a nucleation site for the material to be deposited on the substrate. A crystal of the material nucleates on the substrate, grows through the hole defined by the mask and laterally expands over the surface of the mask. In embodiments of the present disclosure, no mask is needed because the piezoelectric material grows beyond the side surfaces of a post. Conventional LEO techniques are described in "Epitaxial lateral overgrowth techniques used in group III nitride epitaxy," published in the Journal of Physics: Condensed Matter, volume 13, in 2001 (pp. 69661-6975).

The separation between adjacent first piezoelectric films 208A and 208B is characterized by the dimension $\varepsilon$, which can be within any of the following ranges: from 50 µm to 200 µm; from 50 µm to 100 µm; from 100 µm to 200 µm; and from 75 µm to 150 µm.

Piezoelectric layers 208C are formed on the side surfaces of the posts 204, as shown in FIG. 2B, as a consequence of the MOCVD deposition process, which conformally coats surfaces on which the precursors react. The piezoelectric layers 208C are generally not used for the filtering or transmission of incident RF frequencies.

The second piezoelectric layer 212 deposited on an exposed surface of the substrate 200 is deposited concurrently with the first piezoelectric layer 208 using, for example, MOCVD as described above in the context of the first piezoelectric layer 208. The second piezoelectric layer 212 has a thickness $\phi$ that is less than the thickness $\beta$ of the first piezoelectric layer 208 and can be within any of the following ranges: from 500 nanometers (nm) to 2 µm; from 500 nm to 1 µm; from 1 µm to 2 µm; and from 750 nm to 1.5 µm. The thickness $\phi$ being less than the thickness $\beta$ is a natural consequence of the exposed surface of the substrate 200 being disposed further away from a source of MOCVD precursors. This configuration reduces the rate of growth of the second piezoelectric layer 212 compared to the first piezoelectric layer 208 because the precursors have further to travel from their source before deposition. Furthermore, the exposed first end 202 of the post 204 is a pristine surface protected from any processing that may have occurred prior to removal of the mask 206, unlike the exposed surface of the substrate 200. Generally, epitaxial films will grow faster on a pristine surface. For at least these reasons, the dimension $\beta$ is greater than that of the dimension $\phi$.

Having formed 112 the first and second piezoelectric layers 208, 212, conformal electrodes 216 (216A and 216B) are formed 116 on the top and bottom surfaces of the first piezoelectric layers 208. During the same formation 116 of the conformal electrodes 216, a conductive layer 224 is formed 116 on the surface of the piezoelectric layer 212. Much like formation 112 of the first and second epitaxial piezoelectric layers 208, 212, the formation 116 of the electrodes 216 and the conductive layer 224 occurs concurrently using the same material and the same process.

Examples of materials used for both the electrodes 216 and the conductive layer 224 include tungsten (W), molybdenum (Mo), and titanium nitride (TiN). Regardless of the material used for the electrodes 216 and the conductive layer 224, these layers can be deposited using atomic layer deposition (ALD) or chemical vapor deposition (CVD). These deposition techniques, among others, enable conformal deposition of a layer on top and bottom surfaces of the electrodes 216.

The side surfaces of the first piezoelectric layers 208 are free of electrode 216 material. This prevents shorting between the portion of the electrode 216 disposed on a top surface of the first piezoelectric layer 208 with the portion of the electrode disposed on the opposing bottom surface of the first piezoelectric layer 208. These side surfaces may either be masked to prevent metal deposition or can have any metal that does form on these surfaces removed in a separate process (not shown).

Formation of the electrodes 216 onto opposing top and bottom surfaces of the first piezoelectric layer 208 completes the formation of a first resonator 220, shown in FIG. 2C. The first resonator 220 will resonate in response to an incident RF wavelength according to the relationship indicated above.

A thickness of the electrodes 216 and the conductive layer 224 can be in any of the following ranges: 100 nm to 200 nm; 100 nm to 150 nm; 150 nm to 200 nm; and 125 nm to 175 nm.

The dimensions of the various components of the first resonator 220 described above, which are in the range of microns or tens of microns, are greater than many features typically associated with integrated circuit fabrication, which are often on the scale of tens of nanometers. One reason for this larger dimensional scale of the first resonator 220 is that the larger dimensions enable the first piezoelectric layers 208 and the electrodes 216 to absorb significant amounts of RF energy without overheating. Smaller structures may not have enough heat capacity to avoid overheating. Another reason for this larger dimensional scales is that the larger scale enables larger electrical conductors to connect the first resonators 220 to other elements of an RF filter circuit. These larger electrical conductors have lower resistances, which reduces signal loss throughout the circuit.

As also shown in FIG. 2C, a distance of separation between adjacent first resonators 220A and 220B is identified by the dimension $\gamma$. This dimension $\gamma$ can be within any of the following ranges: from 50 µm to 200 µm; from 50 µm to 100 µm; from 100 µm to 200 µm; and from 75 µm to 125 µm. The dimension γ is large enough so that a second SAW resonator can be fabricated between adjacent first resonators 220A and 220B. By fabricating a first resonator 220 and a second resonator within a same filter circuit, two different frequencies can be filtered from among a plurality of frequencies. As indicated above, this is an advantage over conventional filter circuits that generally can only filter a single frequency.

Figure 3:
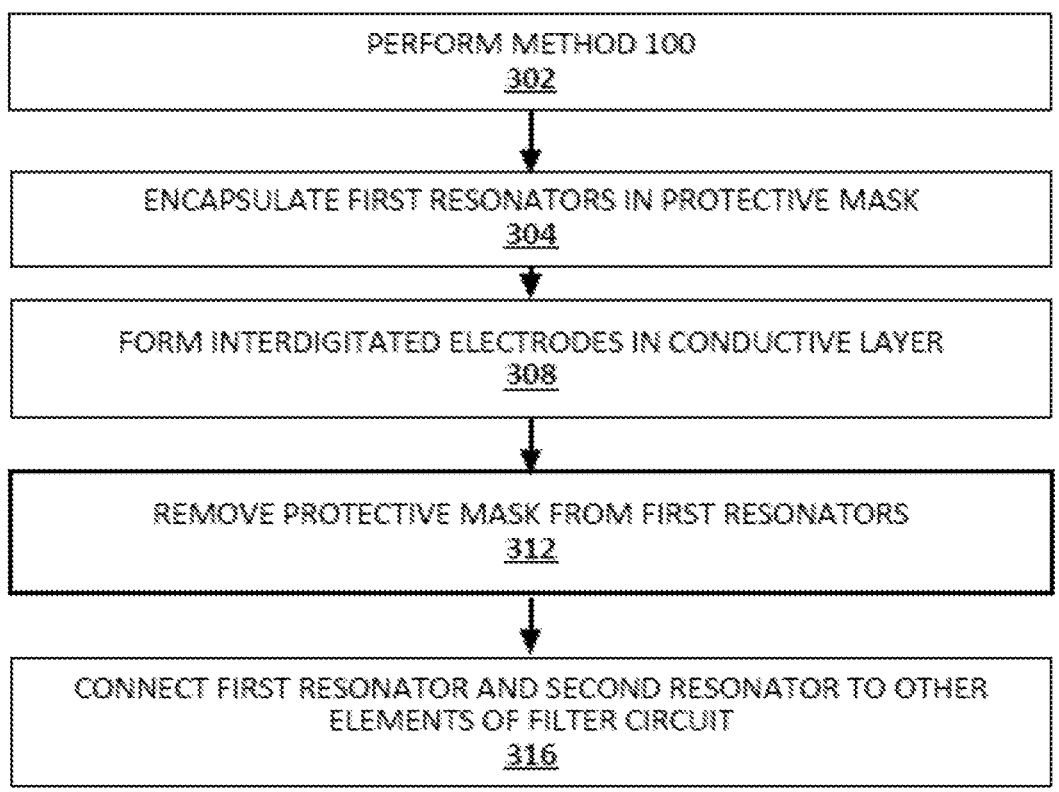
FIG. 3 is a method flow diagram of an example method for fabricating an RF resonator device configured to filter two frequencies from a plurality of incident frequencies, in accordance with an embodiment of the present disclosure.

FIG. 3 is a method flow diagram of an example method 300 for fabricating a thin film bulk acoustic resonator configured to filter two frequencies from a plurality of incident frequencies, in accordance with an embodiment of the present disclosure. Specifically, the method 300 describes a process for adding a second resonator to a substrate that already includes the first resonator so that two separate frequencies can be filtered by a single RF filter circuit. Concurrent reference to FIGS. 4A to 4C which illustrate schematic stages of fabrication of a thin film bulk acoustic resonator having two resonator structures will facilitate explanation of the method 300. The various features in FIGS. 4A to 4C are drawn to facilitate explanation and are not necessarily drawn to scale.

The method 300 begins by performing 302 the method 100 and then encapsulating 304 the first resonators 220 in a protective mask 404. Examples of protective masks include any convenient mask including polymeric photoresists and "hard mask" materials that include oxides and nitrides (such as "interlayer dielectric" materials). Regardless of the type of material used, the protective mask 404 will ultimately be removed upon completion of the method 300, as described below.

Figure 4A:
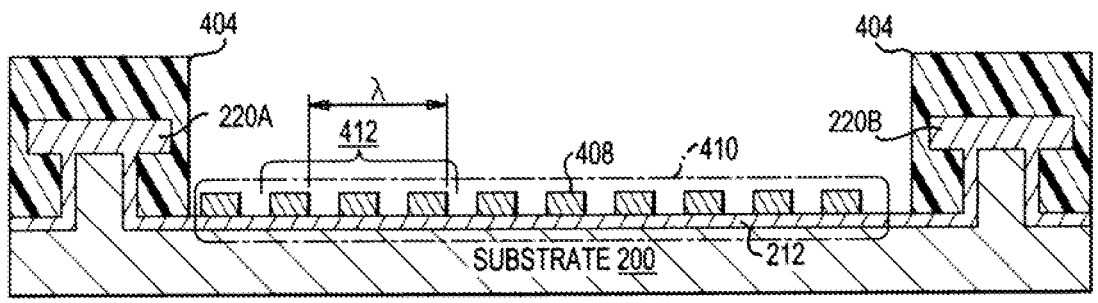
FIGS. 4A-4C are views of an RF resonator device configured to filter two frequencies from a plurality of incident frequencies, in accordance with an embodiment of the present disclosure.
Figure 4B:
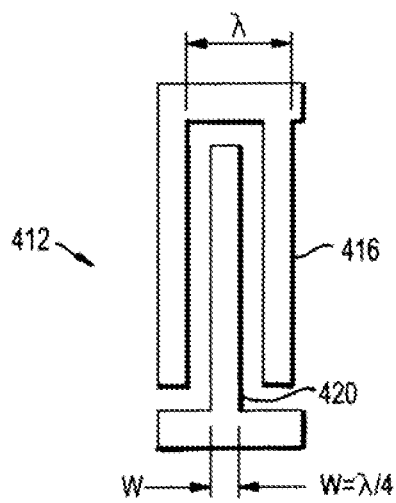
Figure 4C:
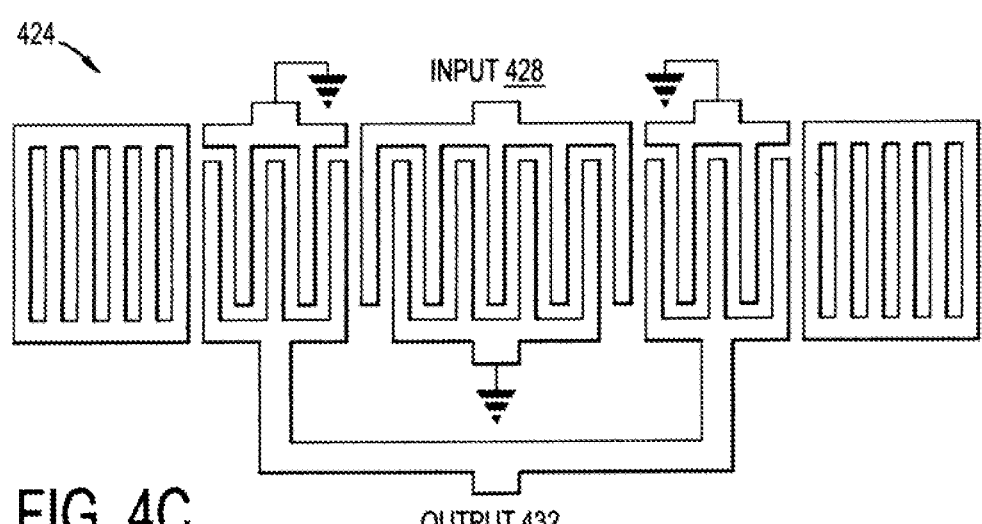

The conductive layer 224 deposited in the method 100 is then subtractively etched to form 308 a plurality of interdigitated electrodes 408, one of which is indicated in FIGS. 4A and 4B as 412. The plurality of interdigitated electrodes 408 are disposed between adjacent first resonators 220A and 220B. The plurality of interdigitated electrodes 408 between the first resonators 220A and 220B, along with the second piezoelectric layer 212, forms a second SAW resonator 410.

Methods used to form 308 the plurality of interdigitated electrodes 408 include conventional photolithography techniques in which a positive or negative mask (e.g., a photoactive polymer) is deposited onto the conductive layer 224, exposed to light and then developed. A subtractive etch is then used to remove portions of the conductive layer 224 unprotected by the mask, thus creating the plurality of interdigitated electrodes 408 from the conductive layer 224.

FIG. 4B illustrates a top view of a single interdigitated electrode 412 that includes a first portion 416 and a second portion 420. Some dimensions of the interdigitated electrode 412 are selected based on the wavelength a surface wave to be generated. As shown in FIG. 4B, the width of the second portion is ¼ of the wavelength of the wave to be produced by the second resonator and the width of the first portion 416 is dimensioned match the wavelength of the wave to be produced by the second resonator 410.

The because the thickness of the second piezoelectric layer 212 is less than that of the first piezoelectric layer 208 of the first resonator 220, the second piezoelectric layer 212 resonates at a different incident frequency that the resonator 220. Thus, as explained above, the configuration shown in FIG. 4A enables a single resonator device to filter two different frequencies. Upon the second piezoelectric layer 212 vibrating in response to a second incident frequency, the vibration activates plurality of interdigitated electrodes 408, which then generate surface acoustic waves according to the dimensions of the various portions of the electrodes 408, as described above. These surface acoustic waves are then processed into an acoustic or data signal by other elements of the filter circuit.

FIG. 4C illustrates a top view of an alternative configuration of a plurality of interdigitated electrodes 424 in which inputs 428 and outputs 432 disposed on a same level are also shown.

Figure 4D:
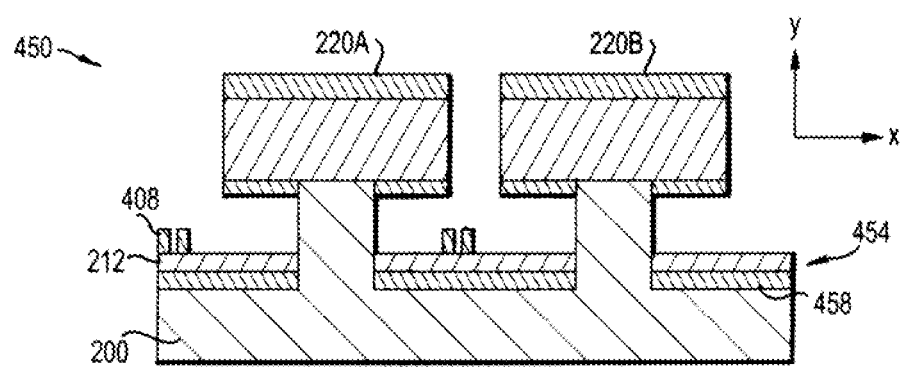
FIG. 4D is a cross-sectional view of an alternative architecture of a thin film bulk acoustic resonator configured to filter two frequencies from a plurality of incident frequencies, in accordance with an embodiment of the present disclosure.
Figure 5:
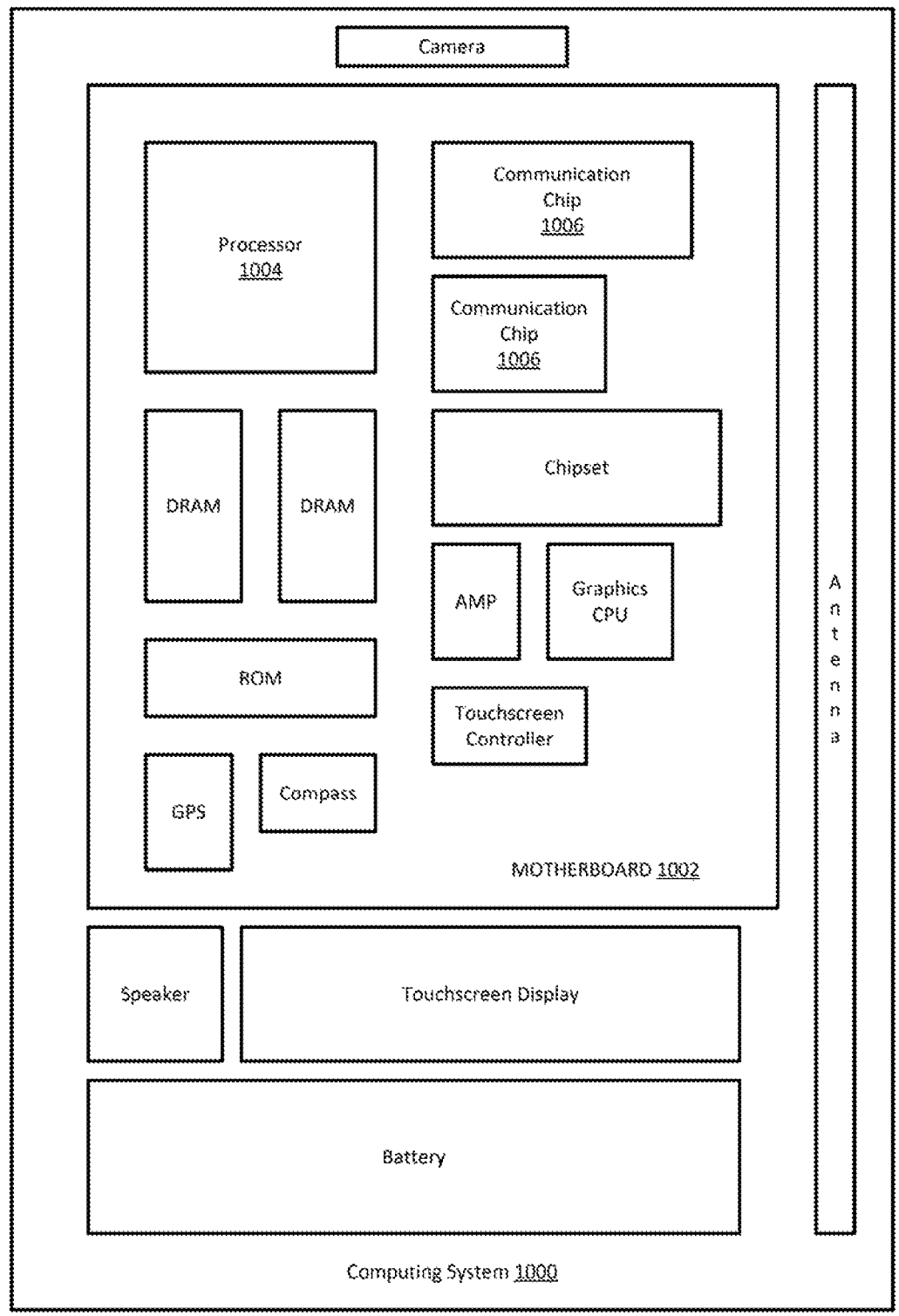
FIG. 5 is an example computing system implemented with one or more of the integrated circuit structures as disclosed herein, in accordance with some embodiments of the present disclosure.

FIG. 4D is a cross-sectional view of an alternative architecture of a thin film bulk acoustic resonator device 450 configured to filter two frequencies from a plurality of received frequencies, in accordance with an embodiment of the present disclosure. Unlike the configuration shown in FIG. 4A, the second resonator 454 shown in FIG. 4D includes a bottom electrode 458 disposed between the substrate 200 and the second piezoelectric layer 212. The plurality of interdigitated electrodes 408 function as a positive electrode. In this embodiment, piezoelectric vibration transmitted to the interdigitated electrodes 408 can also occur through the thickness dimension φ of the second piezoelectric layer 212. That is, in the embodiment shown in FIG. 4A, the vibrations of the piezoelectric layer are limited to those in an x-direction (as indicated by coordinate axes shown in FIG. 4D for convenience of explanation). However, by using the interdigitated electrodes 408 and the bottom electrode 458 together, vibrations in the piezoelectric layer can occur in the y-direction and be used for filtering.

Use of the techniques and structures provided herein may be detectable in cross-sections of an integrated circuit using tools such as scanning electron microscopy (SEM) or transmission electron microscopy (TEM) that can show the various layers and structure of the device. Other methods, such as composition mapping, x-ray crystallography or diffraction (XRD), secondary ion mass spectrometry (SIMS), time-of-flight SIMS (ToF-SIMS), atom probe imaging, local electrode atom probe (LEAP) techniques, 3D tomography, high resolution physical or chemical analysis, to name some suitable example analytical tools. In some embodiments, for instance, a TEM may indicate a combination epitaxial piezoelectric layers of different thicknesses and also indicate the presence of two different configurations of resonators (as described above) within a single resonator device. Numerous configurations and variations will be apparent in light of this disclosure.

Example System

FIG. 6 is an example computing system implemented with one or more of the integrated circuit structures as disclosed herein, in accordance with some embodiments of the present disclosure. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices configured in accordance with an example embodiment (e.g., to include one or more the first resonator and the second resonator in a front end of an RF filter circuit). In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others. In some embodiments, communication chip 1006 may include one or more transistor structures having a gate stack an access region polarization layer as variously described herein.

The processor 1004 of the computing system 1000 includes an integrated circuit die packaged within the processor 1004. In some embodiments, the integrated circuit die of the processor includes onboard circuitry that is implemented with one or more integrated circuit structures or devices as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

Further Example Embodiments

The following examples pertain to further embodiments, from which numerous permutations and configurations will be apparent.

Example 1 is an integrated circuit device comprising: a substrate; a single crystal semiconductor post extending from the substrate, the post having side surfaces defining a post width, the post also having a first end, and a second end opposite the first end, the second end on a first portion of the substrate; a first piezoelectric layer of single crystal semiconductor material disposed on the first end of the single crystal semiconductor post, the first piezoelectric layer having a first width greater than the post width and a first thickness associated with a first resonant frequency; and a conformal electrode layer disposed on a top surface and on a bottom surface of the first piezoelectric layers, the post, the first piezoelectric layer, and the conformal electrode layer collectively forming a first resonator.

Example 2 includes the subject matter of Example 1, further comprising a second piezoelectric layer of single crystal semiconductor material disposed on a second portion of the substrate different from the first portion of the substrate, the second piezoelectric layer having a second thickness less than the first thickness of the first piezoelectric layer.

Example 3 includes the subject matter of Example 2, wherein the first piezoelectric layer and the second piezoelectric layer both include a compound that includes a group III(A) element and nitrogen.

Example 4 includes the subject matter of Examples 2 and 3, wherein a lattice mismatch between a crystal of the substrate and a crystal of the second piezoelectric layer is less than 20%.

Example 5 includes the subject matter of any of Examples 2 through 4, wherein the first piezoelectric layer and the second piezoelectric layer both include aluminum nitride (AlN).

Example 6 includes the subject matter of any of Examples 2 through 5, wherein the first piezoelectric layer and the second piezoelectric layer both include aluminum gallium nitride (AlGaN), where an Al content of the AlGaN is greater than 50 atomic %.

Example 7 includes the subject matter of any of Examples 2 through 6, wherein the first piezoelectric layer and the second piezoelectric layer both include aluminum and nitrogen.

Example 8 includes the subject matter of any of Examples 2 through 7, wherein the first piezoelectric layer and the second piezoelectric layer both include aluminum, gallium, and nitrogen.

Example 9 includes the subject matter of any of Examples 2 through 8, wherein the first thickness of the first piezoelectric layer is from 1 µm to 3 µm, and the second thickness of the second piezoelectric layer is from 500 nm to 2 µm.

Example 10 includes the subject matter of any of Examples 2 through 9, further comprising a plurality of interdigitated electrodes disposed on a surface of the second piezoelectric layer, the plurality of interdigitated electrodes and the second piezoelectric layer collectively forming a second resonator.

Example 11 includes the subject matter of any of Examples 2 through 10, further comprising a bottom electrode disposed between the second piezoelectric layer and the substrate.

Example 12 includes the subject matter of any of Examples 2 through 11, wherein the first resonator is configured to resonate in response to a first applied frequency and the second resonator is configured resonate in response to a second applied frequency different from the first applied frequency.

Example 13 includes the subject matter of any of Examples 2 through 12, wherein each of the first applied frequency and the second applied frequency is in a range of 3 GHz to 10 GHz.

Example 14 includes the subject matter of any of Examples 2 through 13, wherein each of the first applied frequency and the second applied frequency is in a range of 25 GHz to 30 GHz.

Example 15 includes the subject matter of any of Examples 2 through 14, wherein the conformal electrode layer and the plurality of interdigitated electrodes comprise tungsten.

Example 16 includes the subject matter of any of Examples 2 through 15, wherein the conformal electrode layer and the plurality of interdigitated electrodes comprise molybdenum.

Example 17 includes the subject matter of any of Examples 2 through 16, wherein the conformal electrode layer and the plurality of interdigitated electrodes comprise TiN.

Example 18 includes the subject matter of any of Examples 2 through 17, wherein a substrate crystal structure and substrate crystal orientation of the substrate matches a piezoelectric crystal structure and a piezoelectric crystal orientation of the second piezoelectric layer.

Example 19 includes the subject matter of any of Examples 1 through 18, wherein the first thickness of the first piezoelectric layer is from 1 µm to 3 µm.

Example 20 includes the subject matter of any of Examples 1 through 19, wherein a crystal structure and crystal orientation of the single crystal semiconductor post matches a crystal structure and crystal orientation of the first piezoelectric layer.

Example 21 includes the subject matter of any of Examples 1 through 20, wherein a lattice mismatch between a crystal of the single crystal semiconductor post and a crystal of the first piezoelectric layer is less than 20%.

Example 22 includes the subject matter of any of Examples 1 through 21, wherein the first resonant frequency is in a range of 3 GHz to 10 GHz.

Example 23 includes the subject matter of any of Examples 1 through 22, wherein the first resonant frequency is in a range of 25 GHz to 30 GHz.

Example 24 includes the subject matter of any of Examples 1 through 23, further comprising an additional piezoelectric layer on the side surfaces of the post.

Example 25 includes the subject matter of any of Examples 1 through 24, wherein an overgrowth of the first piezoelectric layer is from 3 times to 5 times the first thickness.

Example 26 includes the subject matter of Example 25, wherein the overgrowth is from 5 microns to 15 microns.

Example 27 includes the subject matter of any of Examples 1 through 26, wherein a height of the single crystal semiconductor post is from 1 µm to 10 µm.

Example 28 includes the subject matter of any of Examples 1 through 27, wherein the post width is from 50 µm to 500 µm.

Example 29 includes the subject matter of any of Examples 1 through 28, wherein a separation between adjacent first piezoelectric layers disposed on adjacent posts is from 50 µm to 200 µm.

Example 30 includes the subject matter of any of Examples 1 through 29, wherein a signal produced by the first resonator has a full width at half maximum of the first resonant frequency less than 1.0°.

Example 31 includes the subject matter of any of Examples 1 through 31, wherein a signal produced by the first resonator has a full width at half maximum of the first resonant frequency is in a range of 0.3° to 0.5°.

Example 32 includes the subject matter of any of Examples 1 through 31, wherein the single crystal semiconductor post is tapered such that it is at least 1.5 times wider at its base than its top.

Example 33 includes the subject matter of any of Examples 1 through 32, wherein the post has a triangular cross-section comprising exposed (111) planes of a single crystal of silicon.

Example 34 includes an integrated circuit comprising the integrated circuit device of any of Examples 1 through 33.

Example 35 is a method comprising providing a substrate; forming a single crystal semiconductor post extending from the substrate, the single crystal semiconductor post having side surfaces defining a post width, a first end and a second end in contact with a first portion of the substrate, the second end opposite the first end; epitaxially forming a first piezoelectric layer of single crystal semiconductor material disposed on the first end of the post, the first piezoelectric layer having a first width greater than the post width and a first thickness associated with a first resonant frequency; and forming a conformal electrode layer disposed on a top surface and on a bottom surface the first piezoelectric layer, the post, the first piezoelectric layer, and the conformal electrode layer collectively forming a first resonator.

Example 36 includes the subject matter of Example 35, further comprising forming a second piezoelectric layer of single crystal semiconductor material disposed on a second portion of the substrate different from the first portion of the substrate, the second piezoelectric layer having a second thickness less than the first thickness of the first piezoelectric layer.

Example 37 includes the subject matter of any of Examples 35 through 36, further comprising forming a plurality of interdigitated electrodes disposed on a surface of the second piezoelectric layer, the plurality of interdigitated electrodes and the second piezoelectric layer collectively forming a second resonator.

Example 38 includes the subject matter of any of Examples 35 through 37, wherein the first resonator is configured to resonate in response to a first applied frequency and the second resonator is configured resonate in response to a second applied frequency different from the first applied frequency.

Example 39 includes the subject matter of any of Examples 35 through 38, further comprising forming a bottom electrode disposed between the second piezoelectric layer and the substrate.

Example 40 includes the subject matter of any of Examples 35 through 39, wherein each of the first applied frequency and the second applied frequency is in a range of 3 GHz to 10 GHz.

Example 41 includes the subject matter of any of Examples 35 through 40, wherein each of the first applied frequency and the second applied frequency is in a range of 25 GHz to 30 GHz.

Example 42 includes the subject matter of any of Examples 35 through 41, wherein a signal produced by the second resonator has a full width at half maximum of the first resonant frequency less than 1°.

Example 43 includes the subject matter of any of Examples 35 through 42, wherein a signal produced by the second resonator has a full width at half maximum of the first resonant frequency between 0.3° to 0.5°.

Example 44 includes the subject matter of any of Examples 35 through 43, wherein the first resonant frequency is in a range of 3 GHz to 10 GHz.

Example 45 includes the subject matter of any of Examples 35 through 44, wherein the first resonant frequency is in a range of 25 GHz to 30 GHz.

Example 46 includes the subject matter of any of Examples 35 through 45, wherein a signal produced by the first resonator has a full width at half maximum of the first resonant frequency less than 1°.

Example 47 includes the subject matter of any of Examples 35 through 46, wherein a signal produced by the first resonator has a full width at half maximum of the first resonant frequency is in a range of 0.3° to 0.5°.

The foregoing description of example embodiments has been presented for the purposes of illustration and description. It is not intended to be exhaustive or to limit this disclosure to the precise forms disclosed. Many modifications and variations are possible in light of this disclosure. It is intended that the scope of this disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit device, comprising:
    a substrate;
    a single crystal semiconductor post extending from the substrate, the post having side surfaces defining a post width, the post also having a first end, and a second end opposite the first end, the second end on a portion of the substrate;
    a first layer comprising single crystal piezoelectric semiconductor material and on the first end of the single crystal semiconductor post, the first layer having a width greater than the post width and a first thickness associated with a resonant frequency, and the first layer in direct physical contact with the post; and
    a second layer comprising metal and on a top surface and on a bottom surface of the first layer, wherein the post, the first layer, and the second layer are part of a first resonator.

2. The integrated circuit device of claim 1, wherein the portion of the substrate on which the second end of the post is located is a first portion, and the thickness associated with the resonant frequency is a first thickness, the device further comprising a third layer comprising single crystal piezoelectric semiconductor material on a second portion of the substrate different from the first portion of the substrate, the third layer having a second thickness less than the first thickness of the first layer.

3. The integrated circuit device of claim 2, wherein the first layer and the third layer both include a compound that includes a group III(A) element and nitrogen.

4. The integrated circuit device of claim 3, wherein a lattice mismatch between a crystal of the substrate and a crystal of the third layer is less than 20%.

5. The integrated circuit device of claim 2, wherein the first layer and the third layer both include aluminum and nitrogen.

6. The integrated circuit device of claim 2, wherein the first thickness of the first layer is from 1 µm to 3 µm, and the second thickness of the third layer is from 500 nm to 2 µm.

7. The integrated circuit device of claim 2, further comprising a plurality of interdigitated electrodes on a surface of the third layer, wherein the resonator is a first resonator, and the plurality of interdigitated electrodes and the third layer are part of a second resonator.

8. The integrated circuit device of claim 7, further comprising a bottom electrode between the third layer and the substrate.

9. The integrated circuit device of claim 7, wherein the first resonator is configured to resonate in response to a first applied frequency and the second resonator is configured resonate in response to a second applied frequency different from the first applied frequency.

10. The integrated circuit device of claim 7, wherein the second layer and the plurality of interdigitated electrodes comprise tungsten.

11. The integrated circuit device of claim 2, wherein a crystal structure of the substrate and a crystal orientation of the substrate respectively match a crystal structure of the third layer and a crystal orientation of the third layer.

12. The integrated circuit device of claim 1, wherein a crystal structure and crystal orientation of the single crystal semiconductor post matches a crystal structure and crystal orientation of the first layer.

13. The integrated circuit device of claim 1, wherein the thickness associated with the resonant frequency is a first thickness, and a second thickness of the first layer is from 3 times to 5 times the first thickness.

14. The integrated circuit device of claim 13, wherein the second thickness is from 5 microns to 15 microns.

15. The integrated circuit device of claim 1, wherein a lateral separation between laterally adjacent first layers on adjacent respective posts is from 50 µm to 200 µm.

16. The integrated circuit device of claim 1, wherein the single crystal semiconductor post has a tapered cross-section comprising exposed (111) planes of a single crystal of silicon.

17. An integrated circuit comprising the integrated circuit device of claim 1.

18. A method comprising:
    forming a single crystal semiconductor post extending from a substrate, the post having side surfaces defining a post width, a first end and a second end in contact with a first portion of the substrate, the second end opposite the first end;
    epitaxially forming a first layer of single crystal piezoelectric semiconductor material on the first end of the single crystal semiconductor post, the first layer having a first width greater than the post width and a first thickness associated with a resonant frequency, and the first layer in direct physical contact with the post; and forming a second layer comprising metal and on a top surface and on a bottom surface of the first layer, wherein the post, the first layer, and the second layer are part of a resonator.

19. The method of claim 18, wherein the portion of the substrate on which the second end of the post is located is a first portion, and the thickness associated with the resonant frequency is a first thickness, the method further comprising forming a third layer of single crystal semiconductor material on a second portion of the substrate different from the first portion of the substrate, the third layer having a second thickness less than the first thickness of the first layer.

20. The method of claim 19, wherein the resonator is a first resonator, the method further comprising forming a plurality of interdigitated electrodes on a surface of the third layer, wherein the plurality of interdigitated electrodes and the third layer are part of a second resonator, and wherein the first resonator is configured to resonate in response to a first applied frequency and the second resonator is configured resonate in response to a second applied frequency different from the first applied frequency.

21. An integrated circuit device, comprising:
a substrate;
a single crystal semiconductor post extending from the substrate, the post having side surfaces defining a post width, the post also having a first end, and a second end opposite the first end, the second end on a portion of the substrate;
a first layer comprising single crystal piezoelectric semiconductor material and on the first end of the single crystal semiconductor post, the first layer having a width greater than the post width and a first thickness associated with a resonant frequency; and
a second layer comprising metal and on a top surface and on a bottom surface of the first layer, wherein the post, the first layer, and the second layer are part of a first resonator, wherein the portion of the substrate on which the second end of the post is located is a first portion, and the thickness associated with the resonant frequency is a first thickness, the device further comprising a third layer comprising single crystal piezoelectric semiconductor material on a second portion of the substrate different from the first portion of the substrate, the third layer having a second thickness less than the first thickness of the first layer.

22. The integrated circuit device of claim 21, wherein the first layer and the third layer both include a compound that includes a group III(A) element and nitrogen.

23. The integrated circuit device of claim 21, wherein the first layer and the third layer both include aluminum and nitrogen.

24. The integrated circuit device of claim 21, wherein the first thickness of the first layer is from 1 μm to 3 μm, and the second thickness of the third layer is from 500 nm to 2 μm.

25. An integrated circuit device, comprising:
a substrate;
a single crystal semiconductor post extending from the substrate, the post having side surfaces defining a post width, the post also having a first end, and a second end opposite the first end, the second end on a portion of the substrate;
a first layer comprising single crystal piezoelectric semiconductor material and on the first end of the single crystal semiconductor post, the first layer having a width greater than the post width and a first thickness associated with a resonant frequency, wherein a crystal structure and crystal orientation of the single crystal semiconductor post matches a crystal structure and crystal orientation of the first layer; and
a second layer comprising metal and on a top surface and on a bottom surface of the first layer, wherein the post, the first layer, and the second layer are part of a first resonator.

* * * * *